(12) United States Patent
Tabatabai et al.

(10) Patent No.: US 9,825,657 B2
(45) Date of Patent: Nov. 21, 2017

(54) DIGITAL PRE-DISTORTION LINEARIZATION FOR MOBILE COMMUNICATION

(71) Applicant: Google Inc., Mountain View, CA (US)

(72) Inventors: Farbod Tabatabai, Sausalito, CA (US); Dedi David Haziza, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/993,382

(22) Filed: Jan. 12, 2016

(65) Prior Publication Data

US 2017/0201275 A1    Jul. 13, 2017

(51) Int. Cl.
*H04K 1/02* (2006.01)
*H04L 25/03* (2006.01)
*H04B 1/04* (2006.01)
*H04B 1/62* (2006.01)

(52) U.S. Cl.
CPC ............ *H04B 1/0475* (2013.01); *H04B 1/62* (2013.01); *H04B 2001/0425* (2013.01)

(58) Field of Classification Search
None
See application file for complete search history.

(56) References Cited

U.S. PATENT DOCUMENTS

| | | | | |
|---|---|---|---|---|
| 5,646,578 A * | 7/1997 | Loh | .................. | H03G 3/3042 330/279 |
| 6,275,685 B1 * | 8/2001 | Wessel | .................. | H03F 1/3247 330/149 |
| 7,877,019 B2 * | 1/2011 | Domagala | ............ | H04B 10/296 398/155 |
| 8,666,336 B1 * | 3/2014 | Dick | ..................... | H04B 17/11 375/296 |
| 2002/0171476 A1 * | 11/2002 | Yamamoto | ............ | H03C 3/406 330/10 |
| 2005/0001675 A1 | 1/2005 | Saed | | |
| 2005/0208907 A1 * | 9/2005 | Yamazaki | ................ | H03F 1/34 455/126 |

(Continued)

OTHER PUBLICATIONS

International Search Report and Written Opinion dated Mar. 17, 2017 in PCT Application No. PCT/US2016/068007.

*Primary Examiner* — Shuwang Liu
*Assistant Examiner* — Gina McKie
(74) *Attorney, Agent, or Firm* — McDermott Will & Emery LLP

(57) ABSTRACT

This disclosure provides systems, methods, and apparatus for a radio frequency transceiver. The transceiver includes a modulator for modulating a data signal onto one or more carrier signals to generate a modulated signal and a power amplifier for amplifying the modulated signal. The transceiver also includes a data pre-distorter (DPD) for pre-distorting the data signal using a look-up table that represents a non-linear transfer function that is an inverse of the non-linear transfer function of the power amplifier. The DPD selects one or more look-up tables based on a feedback signal corresponding to a power level and/or a phase of the output of the power amplifier. The transmitter also includes a controller for comparing the output of the power amplifier to a desired output level and upon sensing changes, altering the amplitude and phase of the feedback signal to substantially constant values.

11 Claims, 3 Drawing Sheets

(56) References Cited

U.S. PATENT DOCUMENTS

| | | | |
|---|---|---|---|
| 2006/0091950 A1* | 5/2006 | Hayase | H03F 1/3247 330/149 |
| 2008/0287077 A1* | 11/2008 | Grundlingh | H03F 1/34 455/126 |
| 2010/0148874 A1 | 6/2010 | Thuringer | |
| 2011/0204975 A1* | 8/2011 | Miyashita | H03F 1/3247 330/149 |
| 2015/0111512 A1* | 4/2015 | Tsukizawa | H03G 3/3042 455/127.2 |
| 2015/0207476 A1 | 7/2015 | Kohama et al. | |

* cited by examiner

DIGITAL PRE-DISTORTION LINEARIZATION FOR MOBILE COMMUNICATION

TECHNICAL FIELD

This disclosure relates to the field of wireless communication, and in particular to radio frequency (RF) transmitters.

DESCRIPTION OF THE RELATED TECHNOLOGY

RF transmission systems typically include a data modulator to modulate data onto one or more carrier signals to generate a modulated signal. The RF transmission systems also can include one or more power amplifiers that amplify the modulated signal for transmission over a transmission medium. In some implementations, the power amplifiers can exhibit non-linear characteristics that can distort the amplitude and phase of the modulated signals.

SUMMARY

According to one aspect, the subject matter described in this disclosure relates to a transmitter including a modulator, a power amplifier, a digital pre-distorter (DPD) and a controller. The modulator includes at least one input to receive a data signal and an output, the modulator configured to modulate one or more carrier signals with the data signal to generate a modulated signal at its output. The power amplifier is coupled to the output of the modulator, and is configured to amplifying the modulated signal to generate a power amplifier output signal. The DPD is coupled to the at least one input of the modulator, and is configured to pre-distort the data signal prior to inputting the data signal to the modulator, the pre-distortion based in part on a feedback signal representing an amplitude and a phase of the power amplifier output signal. The controller coupled to the power amplifier and is configured to sense changes in a power level or phase of the power amplifier output signal, and alter the feedback signal such that an amplitude and a phase of the feedback signal are maintained at substantially constant values.

According to another aspect, the subject matter described in this disclosure relates to a method including modulating a data signal over one or more carrier signals using a modulator to generate a modulated signal. The method further includes amplifying the modulated signal using a power amplifier to generate a power amplifier output signal. The method also includes pre-distorting the data signal prior to modulating, the pre-distorting based in part on a feedback signal representing an amplitude and phase of the power amplifier output signal. The method further includes sensing changes in a power level or a phase of the power amplifier output signal. The method additionally includes altering, in response to sensing changes, the feedback signal such that an amplitude and a phase of the feedback signal are maintained at substantially constant values.

BRIEF DESCRIPTION OF THE DRAWINGS

Like reference numbers and designations in the various drawings indicate like elements.

DETAILED DESCRIPTION

The various concepts introduced above and discussed in greater detail below may be implemented in any of numerous ways, as the described concepts are not limited to any particular manner of implementation. Examples of specific implementations and applications are provided primarily for illustrative purposes.

Figure 1:
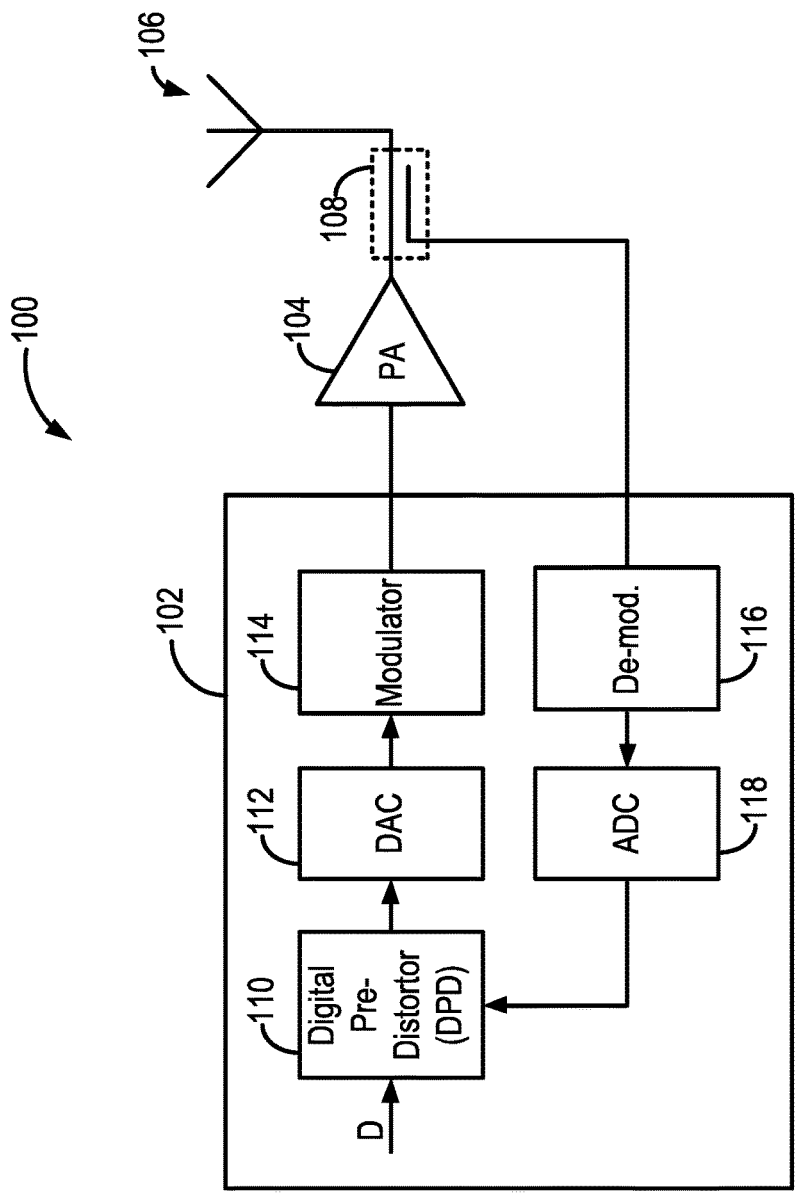
FIG. 1 shows an example wireless transmission system.

FIG. 1 shows an example wireless transmission system 100. The transmission system 100 includes a transceiver 102 coupled to a power amplifier 104, the output of which is coupled to an antenna 106. A coupler 108 is coupled to the output of the power amplifier 104 for sensing the output of the power amplifier and feeding the sensed signal back to the transceiver 102. In some implementations, for example, directional couplers or resistive couplers can be used to implement the coupler 108. The transceiver 102 includes a digital pre-distortion (DPD) module 110, a digital-to-analog converter (DAC) 112, a modulator 114, a demodulator 116, and an analog-to-digital converter (ADC) 118. The DPD module 110 can receive digital data, which is pre-distorted to compensate for the non-linearity of the power amplifier 104. The pre-distorted data is converted into an analog data signal by the DAC 112. The modulator 114 modulates a carrier signal (not shown) with the analog signal and outputs the modulated signal to the input of the power amplifier 104. The demodulator 116 can demodulate the feedback signal from the output of the power amplifier 104 to generate a demodulated feedback signal. The ADC 118 digitizes the demodulated feedback signal and provides the digital feedback signal to the DPD module 110. The digital feedback signal can represent the power level of the output of the power amplifier 104, in two components of amplitude and phase.

In some implementations, the modulator 114 can include an amplitude modulator, a phase modulator, or a frequency modulator. In some implementations, the modulator 114 can include a quadrature modulator that modulates two separate data signals onto two separate quadrature carrier signals and combines the modulated carrier signals to generate the modulated signal. For example, in some implementations, quadrature-amplitude-modulators (QAM) such as 16-QAM, 64-QAM, 128-QAM, 256-QAM, or other higher-order QAM can be utilized to implement the modulator 114. In some such implementations, the input data received at the input of the DPD module 110 can include two separate streams of digital data, including I (in phase) and Q (quadrature phase), each of which can be pre-distorted prior to being converted into separate analog signals by the DAC 112 and provided to the modulator 114.

The power amplifier 104 can provide amplification to the modulated signal output by the modulator 114. The modulated signal output by the modulator 114 could be low or high power RF signal. The power amplifier 104 amplifies the modulated signal to the desired power level for driving the antenna 106. In some implementations, power transistors such BJTs, MOSFETs, heterojunction-bipolar-transistors (HBT), etc., fabricated in silicon, germanium, gallium Nitride, indium-gallium-arsenide, indium-gallium-phosphide, or gallium-arsenide, technologies can be utilized to implement the power amplifier 104. In some implementations, the power amplifier 104 can be implemented using multi-stage amplifiers, where each stage can provide a portion of the overall gain of the power amplifier. In some implementations, the power amplifier 104 can provide high gain in the range of about 20 dB to about 55 dB. In some implementations, the power amplifier 104 can provide high gain over a frequency range of +/−10-20% of the desired frequency.

In some implementations, the power amplifier 104 may exhibit non-linear characteristics. For example, the power amplifier 104 may have a non-linear amplitude and/or phase transfer function. These non-linear characteristics of the power amplifier 104 may cause the amplitude and/or the phase of the output of the power amplifier 104 to be a non-linear function of the amplitude and/or phase of the input signal of the power amplifier 104. The non-linear relationship between the input and the output amplitude and/or phase in a power amplifier can generate amplitude distortion and phase distortion in the modulated signals amplified by the power amplifier. In some implementations, the amplitude and/or phase distortions may cause in-band data errors or inter-band interference. In some implementations, the amplitude and/or phase distortions also can result in high adjacent channel leakage ratio (ACLR) and higher orders of harmonics.

One approach to mitigate the effects of power amplifier non-linearity on the amplitude and phase of the modulated signals is to pre-distort the digital input signals using a non-linear transfer function that is an inverse of the non-linear characteristics of the power amplifier 104. For example, the DPD module 110 can pre-distort the digital data D prior to the data being converted to an analog signal by the DAC 112 by using a non-linear transfer function that is an inverse of the non-linear transfer function of the power amplifier 104. As a result, when the pre-distorted modulated signal is amplified by the power amplifier 104, the distortion imparted by the power amplifier 104 cancels out the pre-distortion imparted by the DPD module 110, resulting in a linearly amplified modulated signal at the output of the power amplifier 104.

In some implementations, the DPD module 110 can perform the pre-distortion using a look-up table, which includes pre-distortion values corresponding to actual values of the digital data signal D. The pre-distortion values in the look-up table can be calculated based on the inverse of the non-linear function of the power amplifier 104. In some other implementations, the DPD module 110 can implement a transformation function that represents the inverse non-linear function of the power amplifier, and can determine the pre-distortion values by transforming the received values of the digital data D using the transformation function. In some other implementations, the DPD module 110 can employ a combination of look-up tables and transformation functions to determine the pre-distorted values of the digital data signal. The look-up tables and the transformation function can be stored in memory (not shown) at the transceiver 102.

In some implementations, the DPD module 110 can adaptively determine the pre-distorted values of the digital data signal D based on the magnitude and/or phase of the output of the power amplifier 104. In some implementations, the non-linear characteristics of the power amplifier 104 can be a function of the output power of the power amplifier 104. That is, the non-linear transfer function representing the power amplifier 104 at one output power level or phase can be different from the non-linear transfer function representing the power amplifier 104 at a different output power level or phase. The output power level or phase of the power amplifier 104, while ideally constant, can change in practice due changes in factors such as the gain of one of more transistors, temperature, or transistor parameters over time.

In adaptive implementations of the DPD module 110, the DPD module 110 can sense the output power amplitude and phase of the amplifier, and select the inverse non-linear transfer function or look-up table corresponding to the sensed output power amplitude and phase value to pre-distort the digital data signal. In some implementations, the number of look-up tables needed to implement an adaptive DPD module 110 can be quite large due to the large number of possible combinations of measured values of the power level and phase. In some such implementations, the large number of look-up tables not only occupy a large amount of memory, but also require large amounts of processing, thereby putting additional burden on the memory and processor of the transceiver 102. The following discussion in relation to FIGS. 2 and 3 relates to a transmission system that mitigates the need for a large number of look up tables, while still providing an effective adaptive DPD module 110.

Figure 2:
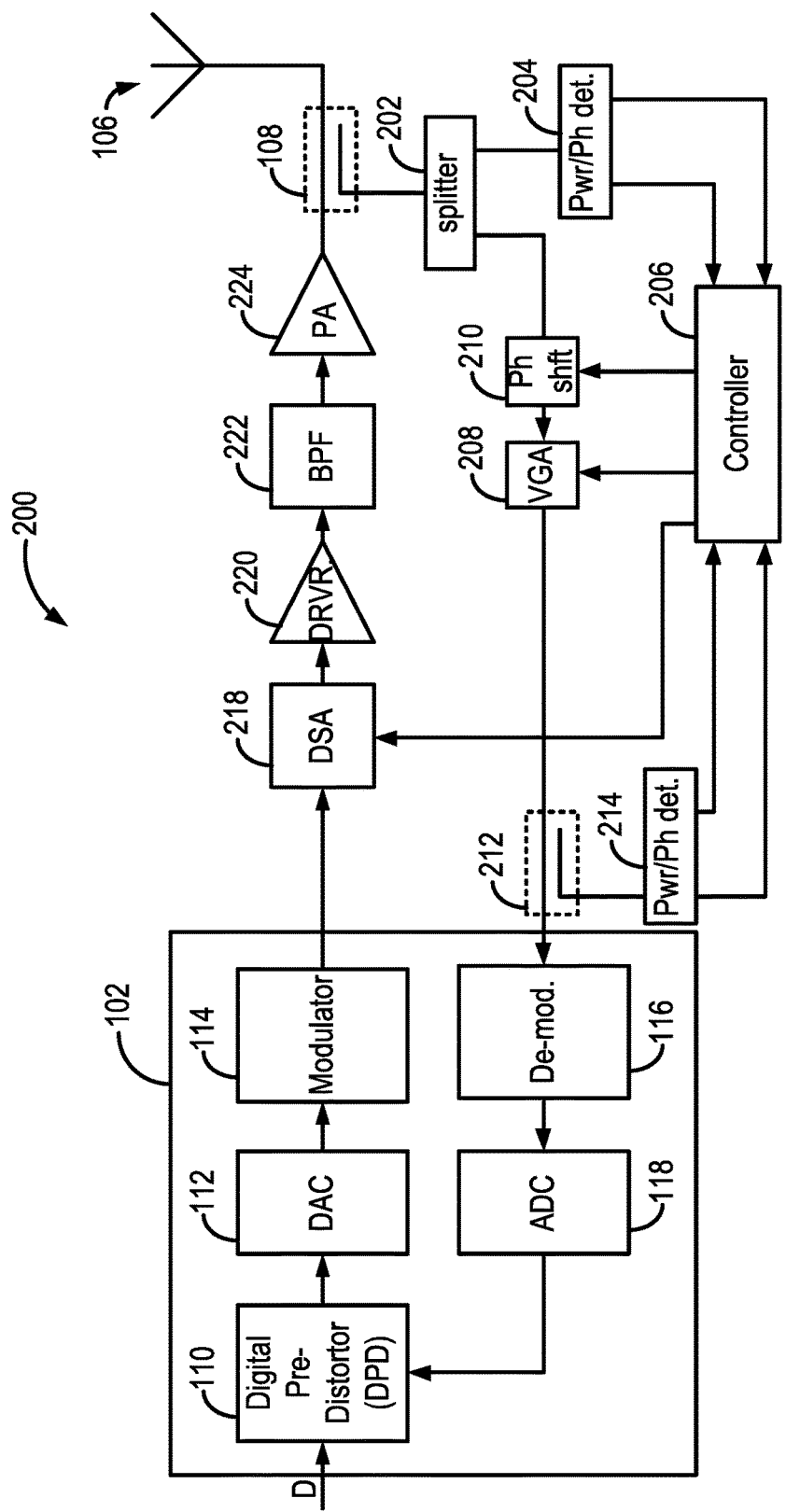
FIG. 2 shows another example wireless transmission system.

FIG. 2 shows another example wireless transmission system 200. The wireless transmission system 200 is similar to the transmission system 100 shown in FIG. 1 in that, like the transmission system 100, shown in FIG. 1, the transmission system 200 in FIG. 2 also includes a transceiver 102, and a coupler 108. However unlike the transmission system 100 shown in FIG. 1, where the output of the coupler was directly fed back to the demodulator 116, the transmission system 200 shown in FIG. 2 includes additional processing modules that process the feedback signal prior to it being received by the demodulator 116. In particular, the transmission system 200 includes a splitter 202, a first power/phase detector 204, a controller 206, a voltage gain amplifier (VGA) 208, a phase shifter 210, a second coupler 212, and a second power/phase detector 214. The transmission system 200 also can include, a digital step attenuator (DSA) 218, a driver 220, and a band-pass filter 222 for processing the modulated signal output by the modulator 114 prior to it being fed to a power amplifier 224. The power amplifier 224 can be a multi-stage amplifier, where each stage can provide a portion of the overall gain of the power amplifier. In some other implementations, the power amplifier 224 can be one stage of an multi-stage power amplifier, where a preceding amplifier, such as the driver 220, can provide a portion of the overall gain. In some implementations, where higher output power, for example, above 30 dBm (1 W), is needed, the power amplifier 224 may not be able to provide the gain required to output the desired output power. In some such implementations, the driver 220 can provide a portion of the required gain. The driver 220 also provides the portion of the gain linearly, and outputs sufficient current to drive the power amplifier 224. For example, the driver 220 can provide 25 to 35 dB of gain for a power output of about 30 dBm (1 W). The band-pass filter 222 can be utilized for suppressing any out of band spurious frequency components or harmonics, and can have a very low insertion loss.

As mentioned above in relation to FIG. 1, the coupler 108 senses the output signal at the output of the power amplifier 104. The sensed output signal is split into two identical signals by the splitter 202. In some implementations, resistors, transformers, or a combination thereof can be used to implement the splitter 202. In some implementations, a Wilkinson divider, or directional coupler also can be utilized for implementing the splitter 202. The first of the two identical sensed signals is fed to a first power/phase detector 204 while the second of the two identical sensed signals is fed to the phase shifter 210 and the VGA 208. The first power/phase detector 204 measures the root-mean-square (RMS) power and the phase of the sensed signal. In some implementations, the power detector portion of the first power/phase detector 204 can be implemented using a full-wave rectifier, followed by a log-antilog circuit and an integrator circuit. In some implementations, a ring mixer can be utilized for implementing the phase detector portion of the first power/phase detector 204. The first power/phase detector 204 can output two analog measurement signals, one representing the measured RMS power and the other representing the measured phase of the output of the power amplifier 104.

The controller 206 can receive the two analog measurement signals output by the first power/phase detector 204. In some implementations, the controller 206 can be implemented using a microcontroller, a microprocessor, a field-programmable-gate logic (FPGA), or digital signal processor (DSP). In some implementations, the controller can include ADCs for converting analog signals to digital signals, while in some other implementations, the ADCs can be outside of the controller 206. In some implementations, the controller 206 also can include a memory for storing output power values, and programs for execution by the execution logic of the controller 206. The RMS and phase measurement signals from the first power/phase detector 204 can be converted to digital signals by the ADCs. Based on the received phase measurement values from the first power/phase detector 204 and the stored values for the desired output power level and phase of the power amplifier, the controller 206 can perform at least two functions. First, the controller 206 can adjust the attenuation provided by DSA 218 so that the output of the power amplifier 224 is substantially equal to the desired power level. Second, the controller 206 can adjust the VGA 208 and the phase shifter 210 such that the amplitude and phase of the feedback signal sent to the DPD module 110 is substantially constant.

By maintaining the feedback signal, which includes the sensed values of the power level and the phase of the output of the power amplifier 224, at substantially constant amplitude and phase, the DPD module 110 needs to store look-up tables for a relatively smaller number of combinations of power level and phase for pre-distorting the digital data signal. In some implementations, the DPD module 110 may require only one look-up table corresponding to the substantially constant values of sensed power level and phase of the output of the power amplifier 104. This reduction in the number of look-up tables needed to pre-distort the digital data signal D also reduces the memory and processing power requirements for the transceiver 102.

The controller 206 also adjusts the attenuation level or gain of the DSA 218 such that the output power level of the power amplifier is substantially equal to the desired output level. For a given desired output power level, the controller 206 can compare the instantaneous RMS power level values and phase values provided by the first power/phase detector 204 with the stored power level and phase values. If there is a difference between the desired and the instantaneous values, the controller 206 can adjust the attenuation level of the DSA such that the output power level returns to the desired output power level. For example, if the power level at the output of the power amplifier 224 decreases, the controller 206 can reduce the attenuation provided by the DSA 218. As a result, the amplitude of the modulated signal at the input of the power amplifier would increase, thereby increasing the output power level of the power amplifier 224. Similarly, if the power level of the output of the power amplifier 104 increases beyond the desired output power level, the controller 206 can increase the attenuation level of the DSA 218, thereby reducing the amplitude of the modulated signal at the input of the power amplifier 224. As a result, the power level of the output of the power amplifier 224 is reduced so that it is substantially equal to the desired power level. In some implementations, the power amplifier 224 can have adjustable gain. In some such implementations, the controller 206 can control the gain of the power amplifier 224 instead of, or in addition to, adjusting the attenuation level of the DSA 218.

In some implementations, it is desirable to operate the power amplifier at high power added efficiency (PAE). PAE is defined as the percentage of power added to a signal received at an input of the power amplifier relative to the power delivered to the power amplifier via the power supply. In some implementations, a high PAE is achieved when the power amplifier is operated at peak power output. In some implementations, the value of the output power level stored in the memory can correspond to the output of the power amplifier 224 at peak power output, so that the power amplifier 224 can operate at the highest PAE.

As mentioned above, the controller 206 can adjust the VGA 208 and the phase shifter 210 such that the amplitude and phase of the feedback signal sent to the DPD module 110 is substantially constant. In some implementations, the transmission system 200 can include additional circuitry to monitor and adjust the feedback signal. For example, the communication system can utilize the second coupler 212 to sense the feedback signal. The second coupler 212 can be similar to the coupler 108 discussed above. The output of the second coupler 212 is provided to the second power/phase detector 214, which detects the power amplitude and phase of the feedback signal. The detected power amplitude and phase of the feedback signal are provided to the controller 206, which can compare the detected amplitude and phase with the stored desired amplitude and phase of the feedback signal. If the detected values are different from the desired values, the controller can further adjust the VGA 208 and the phase shifter 210 such that the amplitude and phase of the feedback signal is substantially constant.

Figure 3:
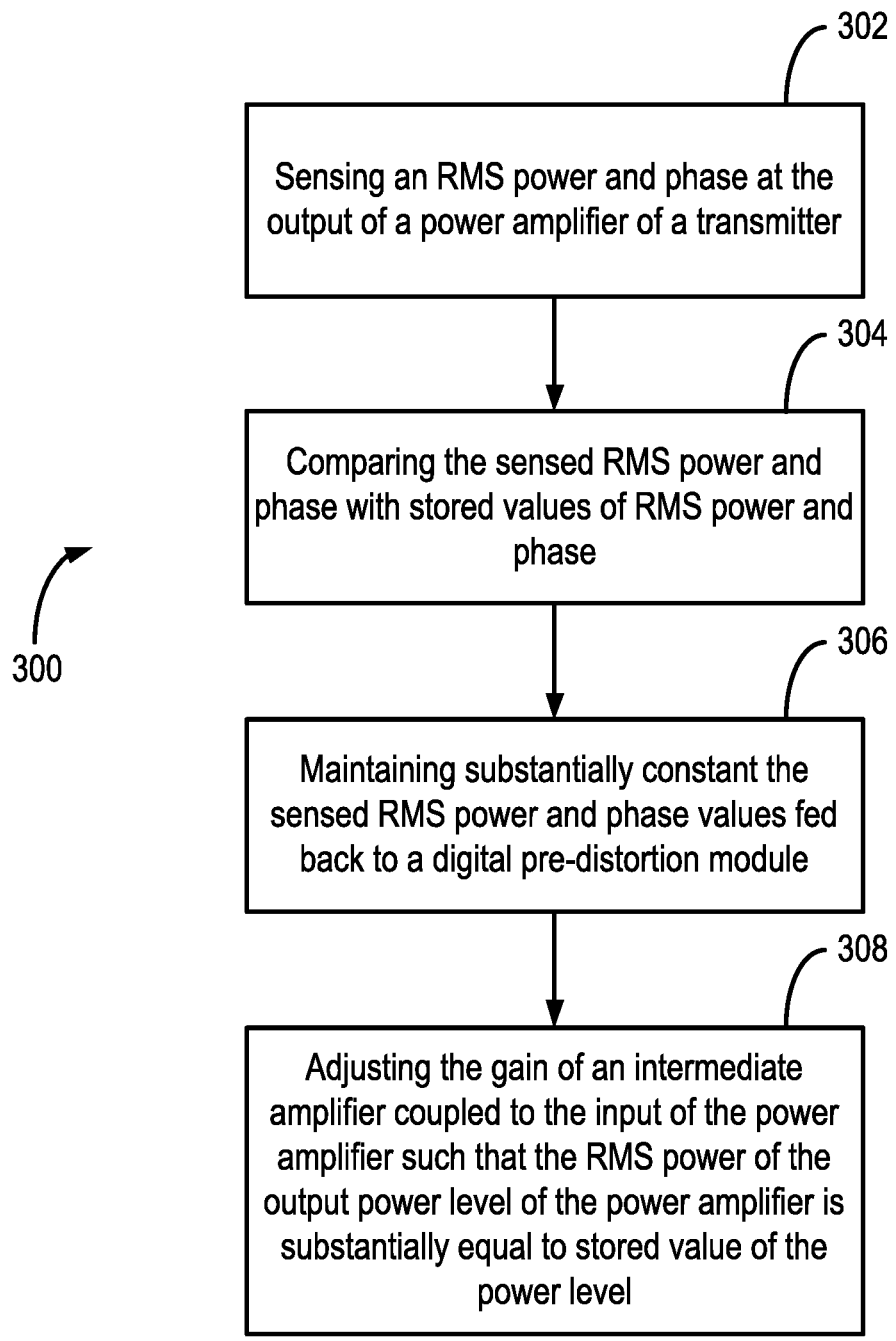
FIG. 3 shows an example flow diagram of a process.

FIG. 3 shows an example flow diagram of a process 300. In particular, the process 300 can be executed by the controller 206 shown in FIG. 2. The process 300 includes sensing the power level and phase at the output of a power amplifier of a transmitter (stage 302). The process 300 further includes comparing the sensed power level and phase with stored values of power level and phase (stage 304). The process 300 also includes maintaining substantially constant the values of the sensed power level and phase fed back to a digital pre-distortion module (stage 306). The process 300 further includes adjusting the gain of an intermediate amplifier coupled to the input of the power amplifier such that the output power level of the power amplifier is substantially equal to the stored value of power level (stage 308).

The process 300 includes sensing the power level and phase at the output of a power amplifier of a transmitter (stage 302). As discussed above in relation to FIG. 2, the first power/phase detector 204 can measure the RMS power level and the phase of the output of the power amplifier 104. The first power/phase detector outputs the measured RMS power level and the phase are provided to the controller 206. The process 300 further includes comparing the sensed power level and phase with stored values of power level and phase (stage 304). As discussed above, the controller 206 can access desired values of power level and phase stored in memory and compare the desired values of the power level and phase to the measured values of the power level and phase. In some implementations, the controller 206 can include ADCs to convert the analog values of the power level and phase output by the first power/phase detector 204 into digital values before comparing with the stored values in memory.

The process also includes maintaining substantially constant, the values of the sensed power level and phase fed back to a digital pre-distortion module (stage 306). As discussed above, the sensed output of the power amplifier 224 shown in FIG. 2 is fed back to the demodulator 116 via a VGA 208 and a phase shifter 210. The gain of the VGA 208 and the phase shift generated by the phase shifter 210 can be controlled by the controller 206. The controller 206, based on the comparison between the instantaneous power level and phase and the stored values of the power level and phase can adjust the gain of the VGA 208 and the phase shift of the phase shifter 210 such that the sensed output of the VGA 208 and the phase shifter has a substantially constant amplitude and phase corresponding to the desired power output level. By maintaining the amplitude and phase of the feedback signal to be substantially constant, the number of look-up tables needed by the DPD module 110 to pre-distort the digital data signal is reduced. As a result, the memory and processing burden on the transceiver for carrying out pre-distortion is advantageously reduced.

The process 300 further includes adjusting the gain of an intermediate amplifier coupled to the input of the power amplifier such that the output power level of the power amplifier is substantially equal to the stored value of power level (stage 308). As discussed above, if the output power level of the power amplifier 224 changes, the controller 206 can adjust the gain or attenuation of the DSA 218, which amplifies/attenuates the modulated signal received from the modulator. By adjusting the gain of the DSA 218, the amplitude of the modulated signal at the input of the power amplifier 224 changes, thereby changing the power level at the output of the power amplifier 224. As a result, the power amplifier 224 can operate at a desired power level. In some implementations, the stored value of the desired power level can correspond to the output power level of the power amplifier operating at peak power output. As a result, the controller 206 can maintain the operation of the power amplifier 224 at peak power output where it can achieve the highest PAE.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A transmitter comprising:
    a modulator having at least one input to receive a data signal and an output, the modulator configured to modulate one or more carrier signals with the data signal to generate a modulated signal at its output;
    a power amplifier coupled to the output of the modulator, the power amplifier configured to amplify the modulated signal to generate a power amplifier output signal;
    a digital pre-distorter (DPD) coupled to the at least one input of the modulator, the DPD configured to pre-distort the data signal prior to inputting the data signal to the modulator, the pre-distortion based in part on a feedback signal representing an amplitude and a phase of the power amplifier output signal;
    a controller coupled to the power amplifier configured to sense changes in a power level or phase of the power amplifier output signal, and alter the feedback signal such that an amplitude and a phase of the feedback signal are maintained at substantially constant values;
    a power detector configured to measure a power level of the modulated signal output by the modulator and provide the measured power level to the controller; and
    a first variable gain amplifier positioned between the modulator and the power amplifier and configured to alter, based on a control signal from the controller, an amplitude of the modulated signal prior to feeding the modulated signal to the input of the power amplifier,
    wherein the controller is further configured to control the first variable gain amplifier based on a comparison between a gain value stored in a memory and a ratio of the measured power level of the modulated signal and the power level of the power amplifier output signal such that a combined gain of the first variable gain amplifier and the power amplifier is substantially equal to the gain value stored in the memory.

2. The transmitter of claim 1, further comprising:
    wherein the controller is configured to control a gain of the first variable gain amplifier such that a power level of the power amplifier output signal is substantially equal to a power level value stored in the memory.

3. The transmitter of claim 2, wherein the power level value stored in the memory corresponds to a peak power level of the power amplifier.

4. The transmitter of claim 2, wherein the first variable gain amplifier is a digital step attenuator, where the gain of the digital step attenuator is controlled step wise based on a digital control signal received from the controller.

5. The transmitter of claim 1, further comprising:
    a second variable gain amplifier configured to change a power level of the feedback signal based on a first control signal received from the controller; and
    a phase shifter configured to shift the phase of the feedback signal based on a second control signal received from the controller.

6. The transmitter of claim 1, wherein the DPD is configured to pre-distort the data signal prior to inputting the data signal to the modulator based in part on an inverse of a non-linear transfer function of the power amplifier.

7. The transmitter of claim 1, wherein the gain value stored in the memory is a predetermined gain value.

8. A method comprising:
    modulating a data signal over one or more carrier signals using a modulator to generate a modulated signal;
    amplifying the modulated signal using a power amplifier to generate a power amplifier output signal;
    pre-distorting the data signal prior to modulating, the pre-distorting based in part on a feedback signal representing an amplitude and a phase of the power amplifier output signal;
    sensing changes in a power level or a phase of the power amplifier output signal;
    altering, in response to sensing changes, the feedback signal such that an amplitude and a phase of the feedback signal are maintained at substantially constant values;
    measuring a power level of the modulated signal at the output of the modulator;
    determining a ratio of the measured power level of the modulated signal and the power level of the power amplifier output signal;
    comparing the ratio to a gain value stored in a memory; and altering, in response to the comparing, a gain of a first variable power amplifier positioned between the modulator and the power amplifier such that a combined gain of the first variable gain amplifier and the power amplifier is substantially equal to the gain value stored in the memory.

9. The method of claim 8, further comprising:
comparing, in response to sensing changes, the power level of the power amplifier output signal with a desired power level stored in the memory; and
altering, in response the comparing, a gain of a first variable power amplifier positioned between the modulator and the power amplifier such that the sensed power level of the power amplifier output signal is substantially equal to the desired power level.

10. The method of claim 8, wherein pre-distorting the data signal includes pre-distorting based additionally on an inverse of a non-linear transfer function of the power amplifier.

11. The method of claim 8, wherein the gain value stored in the memory is a predetermined gain value.

\* \* \* \* \*